(12) United States Patent
Imamura et al.

(10) Patent No.: US 8,514,307 B2
(45) Date of Patent: Aug. 20, 2013

(54) SOLID-STATE IMAGING DEVICE, IMAGING MODULE, AND IMAGING SYSTEM

(75) Inventors: Kunihiro Imamura, Osaka (JP); Keiichi Mori, Osaka (JP)

(73) Assignee: Panasonic Corporation, Osaka (JP)

( * ) Notice: Subject to any disclaimer, the term of this patent is extended or adjusted under 35 U.S.C. 154(b) by 55 days.

(21) Appl. No.: 13/218,226

(22) Filed: Aug. 25, 2011

(65) Prior Publication Data
US 2011/0310277 A1  Dec. 22, 2011

(30) Foreign Application Priority Data

Mar. 5, 2009 (JP) ................................ 2009-051797

(51) Int. Cl.
 H04N 9/64 (2006.01)
 H04N 9/083 (2006.01)
 H04N 3/14 (2006.01)
 H04N 5/335 (2011.01)
 H04N 9/04 (2006.01)

(52) U.S. Cl.
 USPC ........... 348/276; 348/242; 348/277; 348/280

(58) Field of Classification Search
 USPC ................. 348/241, 242, 272–274, 276–277, 348/280
 See application file for complete search history.

(56) References Cited

U.S. PATENT DOCUMENTS

| | | | |
|---|---|---|---|
| 4,513,312 A | 4/1985 | Takemura | |
| 5,914,749 A * | 6/1999 | Bawolek et al. | 348/273 |
| 6,366,319 B1 * | 4/2002 | Bills | 348/273 |
| 8,138,466 B2 * | 3/2012 | Hosaka | 250/226 |
| 8,339,489 B2 * | 12/2012 | Choe et al. | 348/276 |
| 8,363,134 B2 * | 1/2013 | Iwauchi | 348/277 |
| 2004/0239784 A1 * | 12/2004 | Ibe | 348/272 |
| 2006/0177129 A1 | 8/2006 | Matsuyama | |
| 2007/0183657 A1 | 8/2007 | Kidono et al. | |
| 2007/0201114 A1 * | 8/2007 | Egawa | 358/513 |
| 2008/0259191 A1 | 10/2008 | Imamura et al. | |
| 2011/0249157 A1 * | 10/2011 | Fredembach et al. | 348/273 |

FOREIGN PATENT DOCUMENTS

| | | |
|---|---|---|
| JP | 58-56589 | 4/1983 |
| JP | 2006-115160 | 4/2006 |
| JP | 2006-217441 | 8/2006 |
| JP | 2007-184805 | 7/2007 |
| JP | 2008-067058 | 3/2008 |

* cited by examiner

Primary Examiner — Daniel M Pasiewicz
(74) Attorney, Agent, or Firm — McDermott Will & Emery LLP

(57) ABSTRACT

A solid-state imaging device includes a plurality of photoelectric conversion elements configured to perform photoelectric conversion on incident light. The device also includes a color filter array including at least three kinds of color filters different in filtering wavelength region. Any of the color filters is placed for each of the photoelectric conversion elements to filter the incident light. The spectral transmittances of the color filters are equal to each other in a predetermined wavelength region.

26 Claims, 13 Drawing Sheets

SOLID-STATE IMAGING DEVICE, IMAGING MODULE, AND IMAGING SYSTEM

CROSS-REFERENCE TO RELATED APPLICATION

This is a continuation of PCT International Application PCT/JP2009/005826 filed on Nov. 2, 2009, which claims priority to Japanese Patent Application No. 2009-051797 filed on Mar. 5, 2009. The disclosures of these applications including the specifications, the drawings, and the claims are hereby incorporated by reference in their entirety.

BACKGROUND

The present disclosure relates to a solid-state imaging device that has a plurality of pixels each including a color filter for filtering incident light, to output incident light from an object as an imaging signal, and an imaging module and an imaging system using the same.

Solid-state imaging devices are used for imaging systems such as digital video cameras and digital still cameras. Such solid-state imaging devices, which include CCD type, CMOS type, and other type solid-state imaging devices, have a plurality of pixels that perform photoelectric conversion on incident light, and color filters are provided in the respective pixels (see Japanese Patent Publication No. 2006-115160, for example). The colors transmitted by the color filters are set appropriately, to perform color separation of the incident light, whereby a color image can be taken.

SUMMARY

Needs for downsizing imaging systems have been growing in the market, and, for achievement of downsizing of imaging systems, downsizing of solid-state imaging devices has also been in rapid progress. However, when solid-state imaging devices are downsized, color mixture may occur due to crosstalk between a given pixel and its neighboring pixel, causing degradation in image quality. In particular, as the wavelength of light incident on the pixels is longer, the crosstalk is likely to be more significant.

In view of the problem described above, it is an objective of the present disclosure to prevent or reduce degradation in image quality due to crosstalk.

To attain the above objective, an embodiment of the present disclosure is a solid-state imaging device configured to output incident light from an object as an imaging signal, including: a plurality of photoelectric conversion elements configured to perform photoelectric conversion on the incident light; and a color filter array including at least three kinds of color filters different in filtering wavelength region, wherein any of the color filters is placed for each of the photoelectric conversion elements to filter the incident light, and the spectral transmittances of the color filters are equal to each other in a predetermined wavelength region.

With the above configuration, the spectral transmittances of the color filters are equal to each other in a predetermined wavelength region. In the predetermined wavelength region, therefore, a crosstalk component that may occur on a given pixel due to influence of any of its adjoining pixels in the row and column directions is cancelled.

According to the present disclosure, since a crosstalk component that may occur on a given pixel due to influence of any of its adjoining pixels in the row and column directions is cancelled, degradation in image quality due to crosstalk can be prevented or reduced in a predetermined wavelength region.

DETAILED DESCRIPTION

Figure 1:
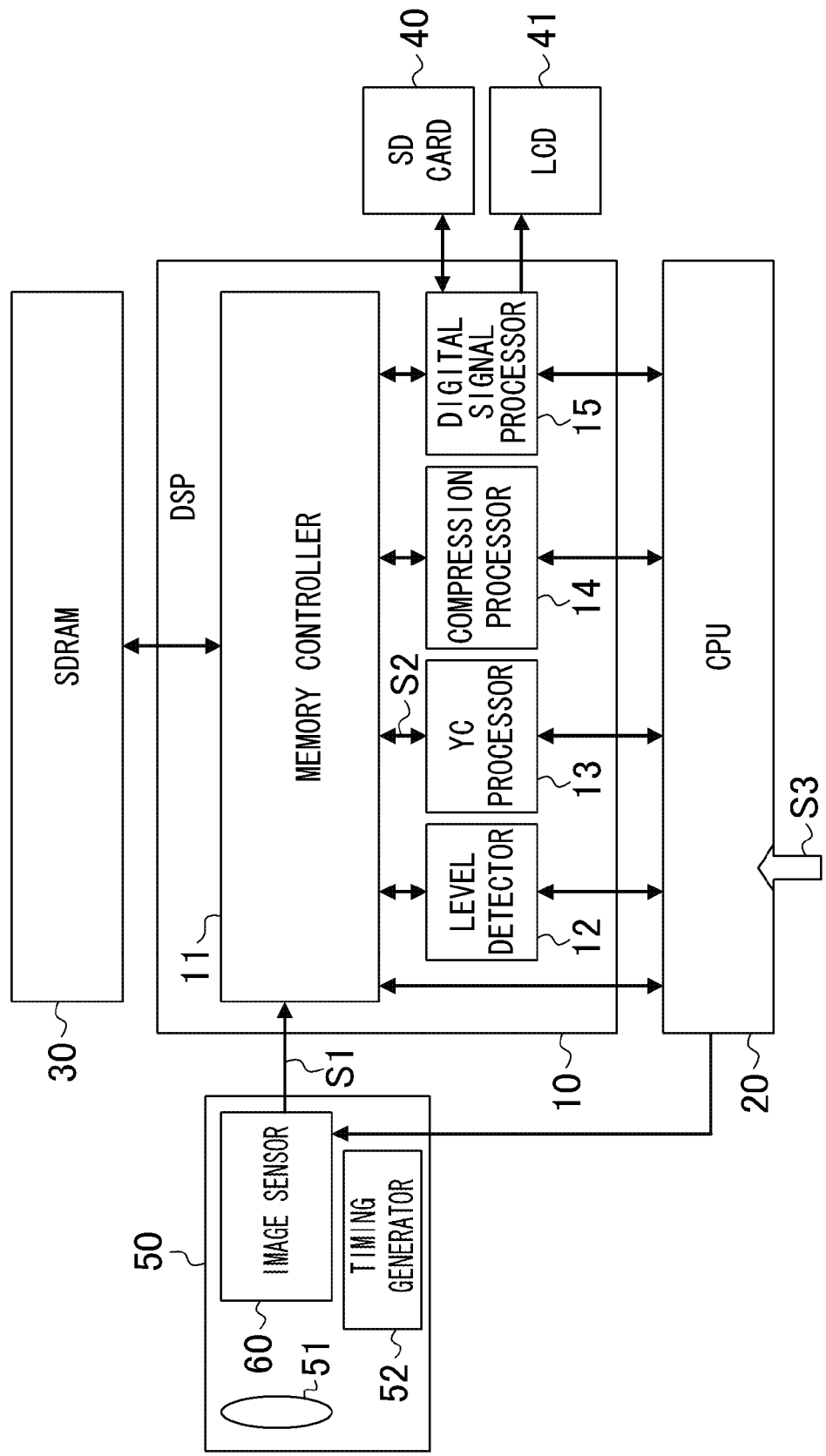
FIG. 1 is a block diagram of a digital video camera of the first embodiment of the present disclosure.

Embodiments of the present disclosure will be described hereinafter with reference to the accompanying drawings. It should be noted that the embodiments to follow are mere essentially preferred examples, and are not intended to limit the scope of the present disclosure, applications thereof, and uses thereof. It should also be noted that components having similar functions to those discussed once are denoted by the same reference characters and description of such components is omitted.

(First Embodiment)

A digital video camera (electronic movie camera) will be described as an example of the imaging system of an embodiment of the present disclosure.

(Outline of Digital Video Camera)

FIG. 1 is a block diagram of a digital video camera 1 of the first embodiment of the present disclosure. As shown in FIG. 1, the digital video camera 1 includes a digital signal processing circuit 10 (DSP in FIG. 1), a CPU 20, an SDRAM 30, an SD card 40, an LCD 41, and an imaging module 50.

In the digital video camera 1, at the time of shooting, the imaging module 50 performs photoelectric conversion on incident light from an object and outputs the result to the digital signal processing circuit 10 as an imaging signal S1. The digital signal processing circuit 10 performs predetermined signal processing on the imaging signal S1, and records the result in the SD card 40 (e.g., an SD memory card) inserted as a recording medium or displays the result on the LCD 41 (e.g., a liquid crystal display) as a display medium. The SDRAM 30 is a recording medium used during the signal processing by the digital signal processing circuit 10. The CPU 20 controls the operation of an image sensor 60 and the digital signal processing circuit 10. The components of the digital video camera 1 will be described individually as follows.

<Digital Signal Processing Circuit (DSP) 10>

The digital signal processing circuit 10 includes a memory controller 11, a level detector 12, a YC processor 13, a compression processor 14, and a digital signal processor 15, and processes the output (imaging signal S1) from the image sensor 60.

—Memory Controller 11—

The memory controller 11 performs data transfer between each of the level detector 12, the YC processor 13, the compression processor 14, and the digital signal processor 15 (hereinafter these processors are generically called function blocks) and the SDRAM 30 (i.e., reads/writes data from/into the SDRAM 30). In the digital signal processing circuit 10, the imaging signal S1 is written in the SDRAM 30 until data units of the imaging signal S1 corresponding to the number of pixels required for processing in each function block are accumulated. Once data units of the imaging signal S1 corresponding to the necessary number of pixels are accumulated, the memory controller 11 reads the imaging signal S1 from the SDRAM 30 as appropriate and outputs the signal to the function block requiring the imaging signal S1. In the digital video camera 1, not only the imaging signal S1, but also a luminance signal and color signals obtained from the processing by the YC processor 13, encoded data, etc. obtained from the processing by the compression processor 14 are also recorded in the SDRAM 30. Therefore, the memory controller 11 also reads/writes these signals and data from/into the SDRAM 30.

—Level Detector 12—

The level detector 12 detects the level of the imaging signal S1 and notifies the CPU 20 of the level of the imaging signal S1. More specifically, the level detector 12 calculates the level of the imaging signal S1 output from the image sensor 60 based on the average value, etc. of the entire or part of the frame of the image sensor 60, and notifies the CPU 20 of the calculation result.

—YC Processor 13—

The YC processor 13 performs synchronization, filtering, frequency correction, etc. on the imaging signal S1, and generates a luminance signal and color difference signals (hereinafter these signals are collectively called YC signals S2). The YC processor 13 also performs signal processing of compensating high-frequency components of the luminance signal depending on the magnitude of the red component that is a color component on the long-wavelength side. This is because a portion of incident light on the long-wavelength side leaks to an adjoining pixel due to crosstalk, causing degradation in resolution. In other words, by this processing, the resolution of the red component dispersed into a plurality of pixels due to a crosstalk component can be improved.

—Compression Processor 14—

The compression processor 14 compresses the imaging signal S1 output from the image sensor 60 in the state of raw data. The compression processor 14 also compresses the YC signal S2 (luminance signal and color difference signals generated by the YC processor 13) according to a predetermined format. More specifically, the data amount is compressed according to JPEG format when the data is a still image, or compressed according to H.264 format, etc. when it is a moving image, for example.

—Digital Signal Processor 15—

The digital signal processor 15 performs signal processing required for the operation as the digital video camera, such as scaling (zooming) processing for adjustment of the field angle size, defect correction, and illuminating light color temperature detection. The digital signal processor 15 also reads/writes data from/into the inserted SD card 40, and displays an image such as a preview on the LCD 41 as a display medium.

<CPU 20>

The CPU 20 outputs control signals, required for achievement of the operation of the digital video camera 1 expected by the user, to the image sensor 60 and the function blocks of the digital signal processing circuit 10. For example, the CPU 20 performs switching on whether to read the imaging signal S1 in a mixed state or in a non-mixed state, setting of parameters, etc. for the image processing by the YC processor 13, etc. for the imaging module 50 and the function blocks of the digital signal processing circuit 10. The CPU 20 receives signals for setting the release button and the operation of the digital video camera 1 from outside (external input S3).

<Imaging Module 50>

The imaging module 50 includes a lens 51, a timing generator 52, and the image sensor 60. The lens 51 focuses light from an object on the image sensor 60. The timing generator 52 generates a control signal required for driving the image sensor 60.

—Image Sensor 60—

Figure 2:
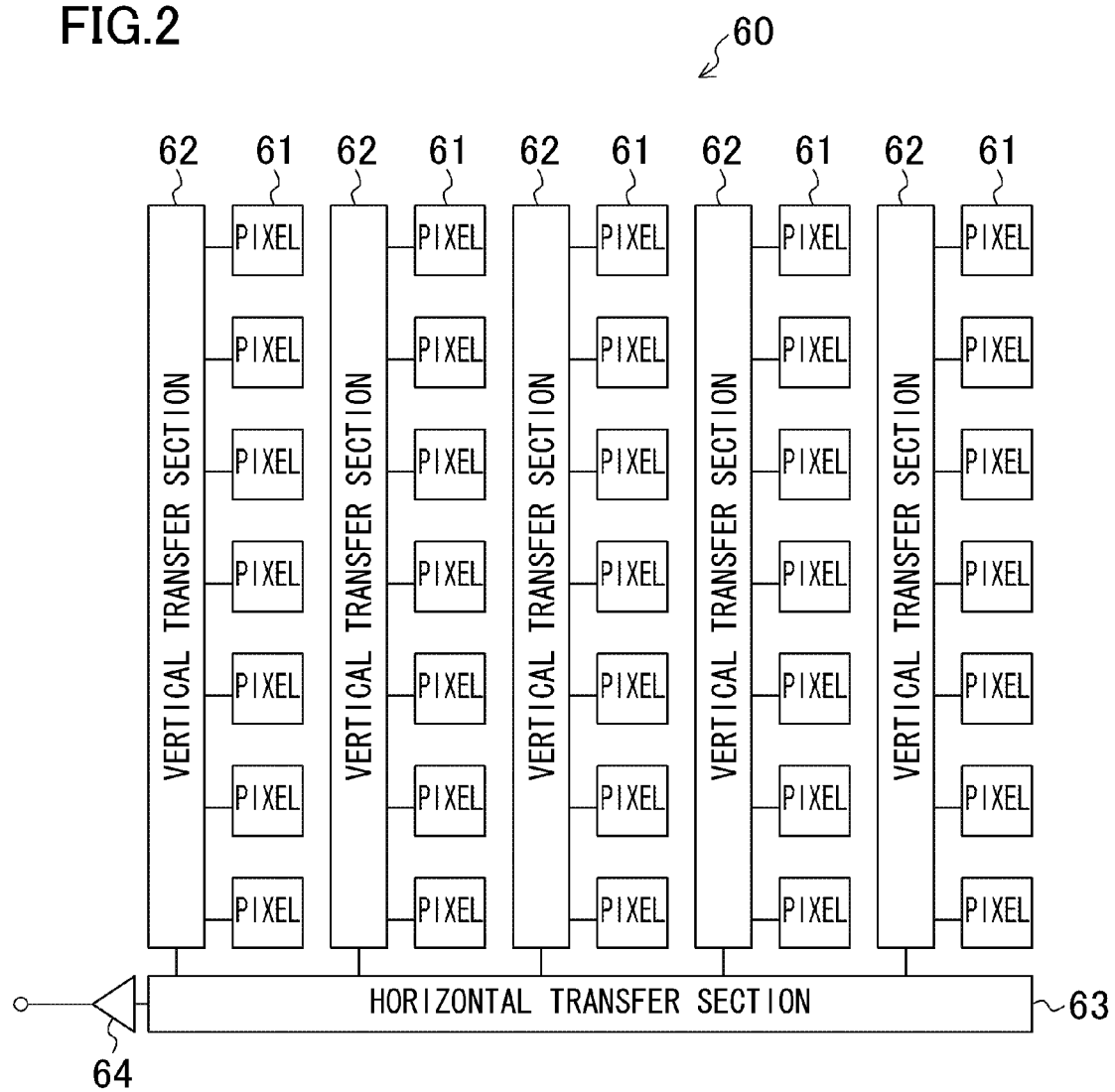
FIG. 2 is a view showing a configuration of an image sensor of the first embodiment.

The image sensor 60 performs photoelectric conversion on the light from the lens 51 and outputs the result to the digital signal processing circuit 10 as the imaging signal S1. In other words, the image sensor 60 is an example of the solid-state imaging device of the present disclosure. In this embodiment, a charge coupled device (CCD) type solid-state imaging device is used as the image sensor 60, which is a surface irradiation type image sensor. FIG. 2 is a view showing a configuration of the image sensor 60. As shown in FIG. 2, the image sensor 60 includes a plurality of pixels 61, vertical transfer sections 62, a horizontal transfer section 63, and a signal output section 64.

In the image sensor 60, the pixels 61 are arranged two-dimensionally (in a matrix). Each of the pixels 61 performs photoelectric conversion to convert incident light into an electric charge. Note that FIG. 2 shows a schematic structure of the image sensor 60, and the image sensor 60 actually has a larger number of pixels 61 than those shown in FIG. 2.

The vertical transfer sections 62, provided to correspond to the respective columns of pixels 61, transfer the electric charges from the pixels 61 of the corresponding columns toward the horizontal transfer section 63. The horizontal transfer section 63 transfers the electric charges transferred from the vertical transfer sections 62 to the signal output section 64. The signal output section 64 converts the transferred electric charges into a voltage signal by a floating diffusion (not shown), and outputs the voltage signal from the image sensor 60 as the imaging signal S1 corresponding to the incident light.

(Sectional Structure of Image Sensor 60)

Figure 3:
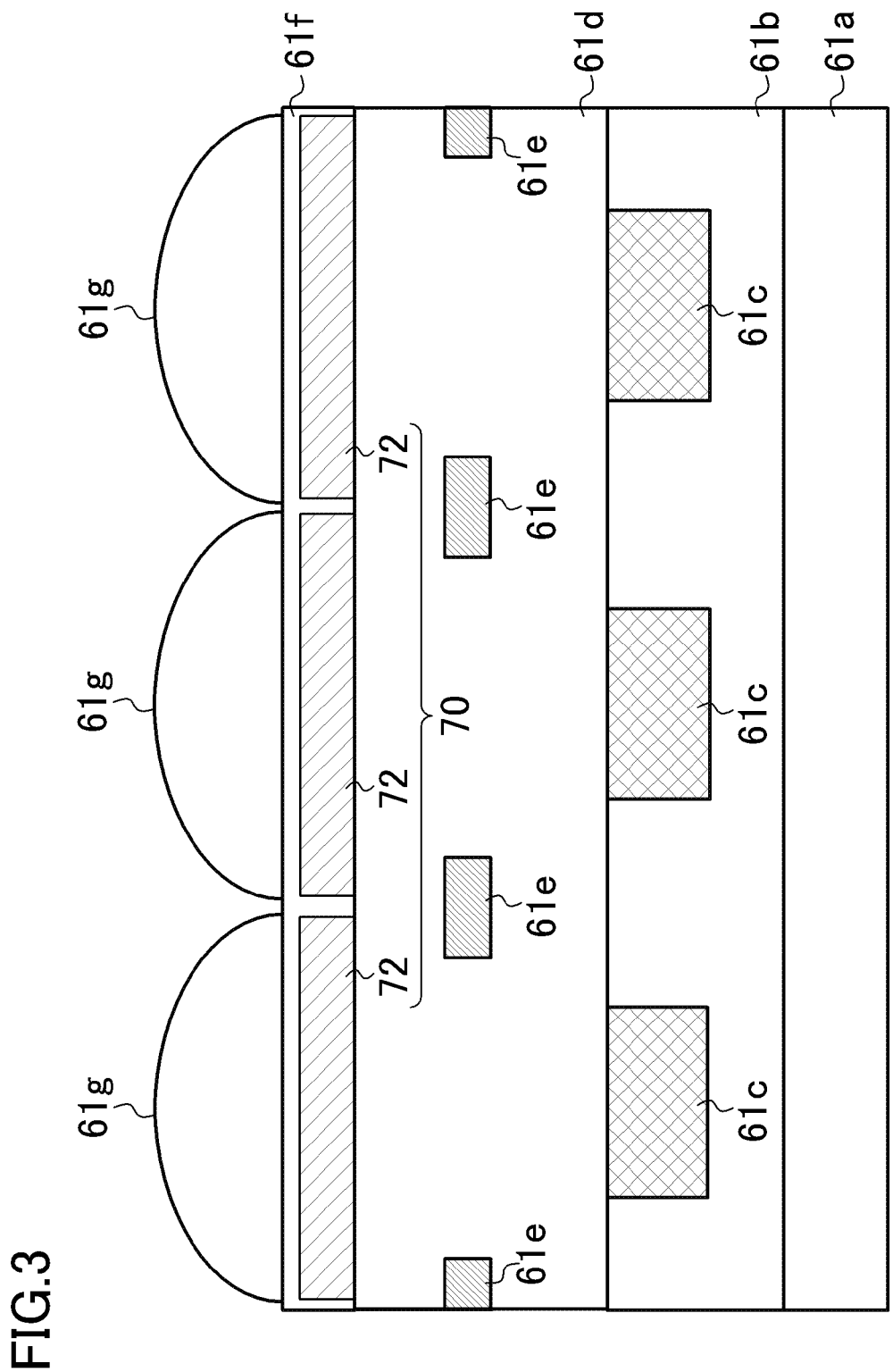
FIG. 3 is a cross-sectional view of a pixel portion of the image sensor.

FIG. 3 is a cross-sectional view of a pixel portion of the image sensor 60. As shown in FIG. 3, the image sensor 60 includes an n-type semiconductor layer 61a, a p-type semiconductor layer 61b, photoelectric conversion elements 61c, an insulating film 61d, a light-shielding film 61e, a planarizing film 61f, light-collecting lenses 61g (microlenses), and color filters 72.

In the image sensor 60, as shown in FIG. 3, the p-type semiconductor layer 61b is formed on the n-type semiconductor layer 61a, and n-type impurity ions are implanted in the p-type semiconductor layer 61b, to form the photoelectric conversion elements 61c. One photoelectric conversion element 61c corresponds to one pixel 61. The light-transmissive insulating film 61d is formed on the p-type semiconductor layer 61b.

The color filters 72 are formed on the insulating film 61d for the respective photoelectric conversion elements 61c. In other words, the image sensor 60 has a plurality of color filters 72, and these color filters 72 constitute a color filter array 70.

Each of the color filters 72 has a spectral transmittance corresponding to the color to be separated, and the number of kinds of the color filters 72 is equal to the number required for color separation. In other words, the color filter array 70 includes at least three kinds of the color filters 72 different in the wavelength region to filter from one another. The color filters 72 of these kinds are equal in spectral transmittance in a predetermined wavelength region. The spectral transmittances of the color filters 72 will be described later in detail.

The planarizing film 61f is formed on the color filters 72 for planarizing the elements. The planarizing film 61f is made of silicon dioxide. The light-collecting lenses 61g are provided on the planarizing film 61f for the respective color filters 72, and collect incident light on the corresponding photoelectric conversion elements 61c. The light-shielding film 61e is provided in the insulating film 61d to allow only light having passed through the specific color filters 72 to be incident on the corresponding photoelectric conversion elements 61c.

<Configuration of Color Filter Array 70>

In the image sensor 60, the color filter array 70 includes unit arrays 71 of n rows×m columns each (n and m are natural numbers) arranged periodically. The unit array 71 is constituted by at least three kinds of color filters out of red, magenta, yellow, and white color filters 72. With this arrangement, a crosstalk component occurring significantly on the long-wavelength side can be cancelled in generation of a color video signal, as will be discussed later.

Figure 4:
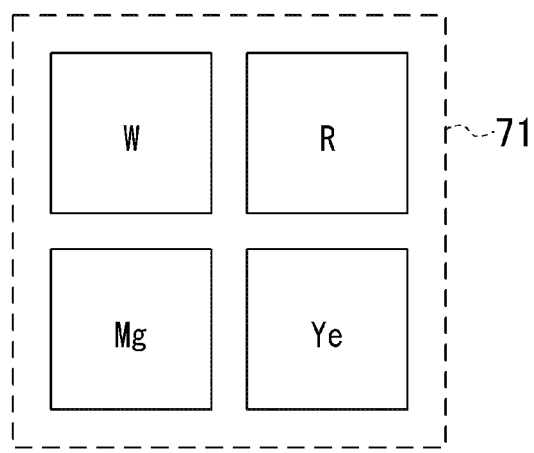
FIG. 4 is a view showing a unit array in the first embodiment.

FIG. 4 is a view showing a configuration of the unit array 71 in this embodiment. This unit array 71 includes two rows×two columns of color filters 72. In FIG. 4, W, R, Mg, and Ye indicate the color components, i.e., white, red, magenta, and yellow components, respectively, transmitted by the respective color filters 72. That is, the unit array 71 is constituted by four kinds of color filters 72. This indicates that, in the unit array 71 in this embodiment, all kinds of the color filters 72 transmit the red component. The color filters 72 are formed of organic pigments, and the spectral transmittances are determined by the pigments. Using such organic materials, color filters 72 high in the precision of the spectral transmittances can be produced, and as a result, the color reproducibility enhances, permitting improvement in image quality. The color filters 72 prevent or reduce transmission of light by absorbing the light. In other words, the spectral transmittances of the color filters 72 using organic materials are determined mainly by absorption.

Figure 5:
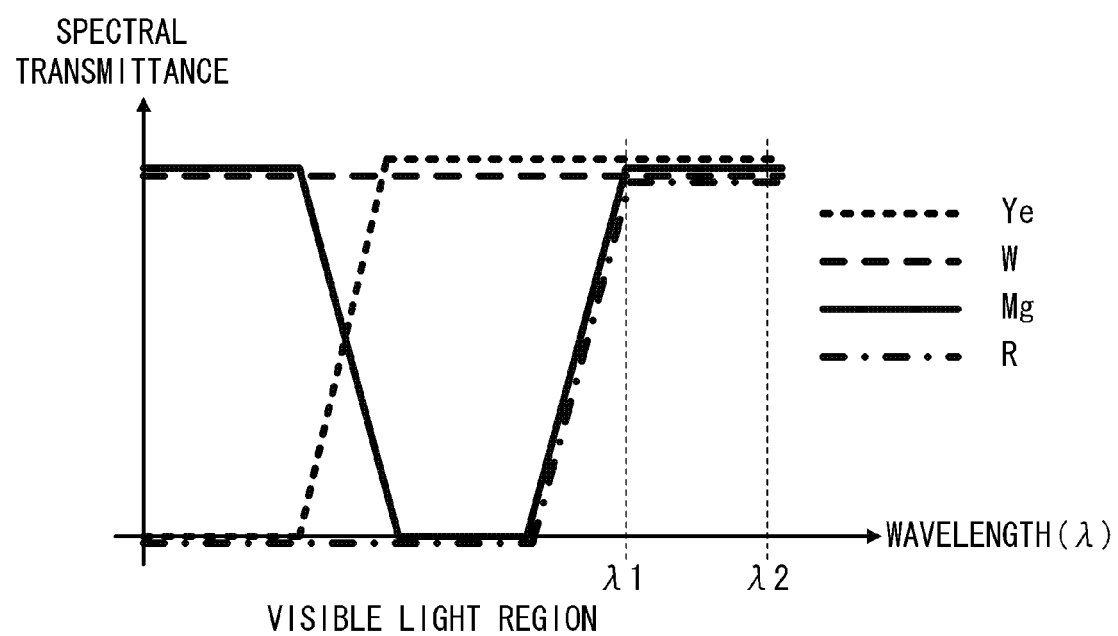
FIG. 5 is a view schematically showing spectral transmittances of W, R, Mg, and Ye color filters.

FIG. 5 is a view schematically showing the spectral transmittances of the color filters 72 transmitting W, R, Mg, and Ye color components. In FIG. 5, the spectral transmittance of the color filter 72 transmitting W is indicated by the dashed line, that of the color filter 72 transmitting R is indicated by the one-dot dashed line, that of the color filter 72 transmitting Mg is indicated by the solid line, and that of the color filter 72 transmitting Ye is indicated by the dotted line. In a wavelength region of λ1 to λ2 (region on the long-wavelength side of the visible light region (380 nm to 780 nm)), the spectral transmittances of the four kinds of the color filters 72 are equal to one another, although they are shown as if being different values in FIG. 5 for convenience in illustration. That is, as described earlier, all kinds of the color filters 72 of the image sensor 60 of this embodiment transmit the red component.

(Crosstalk in Image Sensor 60)

Figure 6:
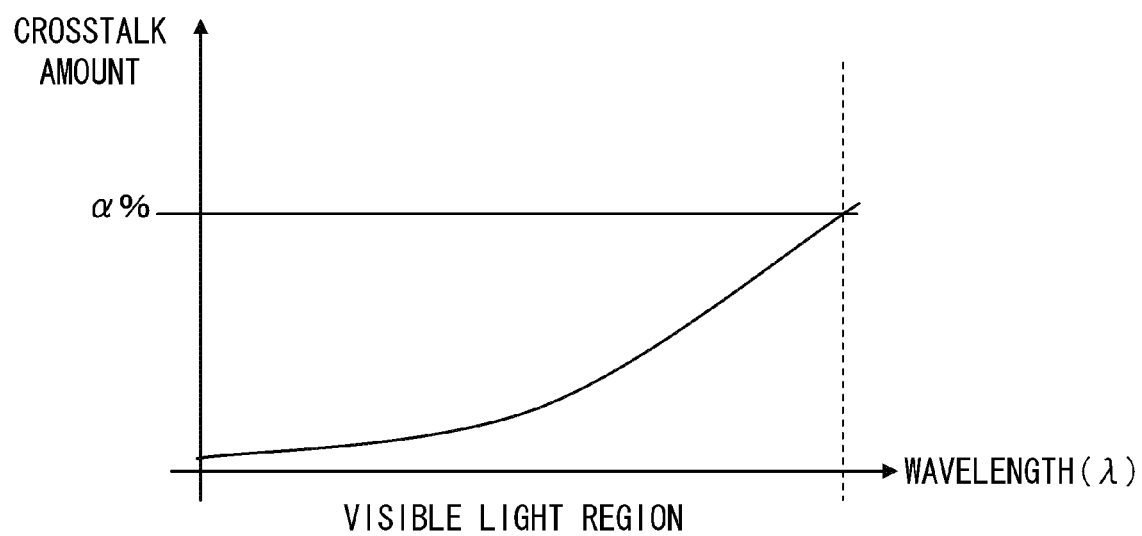
FIG. 6 is a view showing the crosstalk amount in a pixel.

Next, the crosstalk amount in the image sensor 60 will be described. FIG. 6 shows the crosstalk amount in a pixel 61, indicating to what extent light incident on a given pixel 61 affects its adjoining pixel 61. In FIG. 6, in which the x-axis represents the wavelength (λ) of the incident light, the crosstalk amount is larger on the long-wavelength side than on the short-wavelength side.

The crosstalk varies in its characteristics depending on the direction of the adjoining pixel with respect to the given pixel 61, the structure of the pixels, etc. Here, for simplicity of description, it is assumed that a given pixel 61 undergoes influence of crosstalk from only its vertically and horizontally adjoining pixels and that any influence from diagonally adjacent pixels and pixels located farther than the adjoining pixels can be neglected. Also, since the crosstalk amount on the long-wavelength side is large in general, the following description will be made using this characteristic as a representative one in this embodiment.

To clarify the difference from the conventional case, the description of the crosstalk will be made comparing the spectral transmittances in the image sensor 60 of this embodiment with those in an image sensor having unit arrays of the primary-color Bayer array.

Each of the pixels 61 of the image sensor 60 undergoes influence of crosstalk from the color filters 72 of the two adjoining pixels 61 in the column direction and the color filters 72 of the two adjoining pixels 61 in the row direction. More specifically, each of the pixels 61 corresponding to the color filters 72 transmitting W color (hereinafter such color filters are simply referred to as W color filters 72; the other kinds of the color filters 72 are also abbreviated similarly) undergoes influence of crosstalk from two Mg color filters and two R color filters. Likewise, each of the pixels 61 corresponding to the R color filters 72 undergoes influence of crosstalk from two Ye color filters and two W color filters. Each of the pixels 61 corresponding to the Mg color filters 72 undergoes influence of crosstalk from two W color filters and two Ye color filters. Each of the pixels 61 corresponding to the Ye color filters 72 undergoes influence of crosstalk from two R color filters and two Mg color filters.

Figure 7:
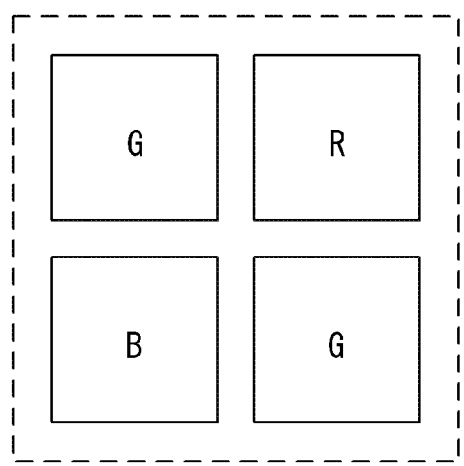
FIG. 7 is a view showing a unit array of a so-called primary-color Bayer array.

By contrast, FIG. 7 is a view showing a unit array of the primary-color Bayer array. In FIG. 7, G, R, and B indicate the color components, i.e., green, red, and blue components, respectively, transmitted by the respective color filters. In this array, also, each pixel undergoes influence of crosstalk from the color filters of the two adjoining pixels in the column direction and the color filters of the two adjoining pixels in the row direction. In this primary-color Bayer array, each of the pixels corresponding to the G color filters either adjoins to two R color filters in the row direction and two B color filters in the column direction, or adjoins to two B color filters in the row direction and two R color filters in the column direction. In either case, the pixel undergoes influence of crosstalk from two R color filters and two B color filters. Each of the pixels corresponding to the R color filters adjoins to G color filters in both the row and column directions, and undergoes influence of crosstalk from these four color filters. Likewise, each of the pixels corresponding to the B color filters adjoins to G color filters in both the row and column directions, and undergoes influence of crosstalk from these four color filters.

The spectral transmittance of a given pixel at a wavelength λ can be represented by relational expression (1) below, which is an expression considering influence of crosstalk from its adjoining pixels (color filters) in the row and column directions. Note that the "spectral transmittance (λ) of a given pixel" in the relational expression (1) refers to the value obtained when the spectral transmittance of the pixel 61 is singly evaluated, i.e., the spectral transmittance free from any influence of crosstalk.

$$\begin{aligned}
&\text{Spectral transmittance } (\lambda) \text{ considering influence of crosstalk} = \\
&\quad (1 - 4 \times \text{crosstalk amount } (\lambda)) \times \\
&\quad \text{spectral transmittance } (\lambda) \text{ of a given pixel} + \\
&\quad \text{crosstalk amount } (\lambda) \times \text{spectral transmittance } (\lambda) \text{ of one} \\
&\quad \text{pixel adjoining to the given pixel in the column direction} + \\
&\quad \text{crosstalk amount } (\lambda) \times \text{spectral transmittance } (\lambda) \text{ of the other} \\
&\quad \text{pixel adjoining to the given pixel in the column direction} + \\
&\quad \text{crosstalk amount } (\lambda) \times \text{spectral transmittance } (\lambda) \text{ of one} \\
&\quad \text{pixel adjoining to the given pixel in the row direction} + \\
&\quad \text{crosstalk amount } (\lambda) \times \text{spectral transmittance } (\lambda) \text{ of the} \\
&\quad \text{other pixel adjoining to the given in the row direction}
\end{aligned} \quad (1)$$

The relational expression (1) indicates that, in the given wavelength $\lambda$, the incident light on the given pixel 61 leaks by the crosstalk amount ($\lambda$) to its four adjoining pixels 61 in the row and column directions, and the incident light on each of the four pixels 61 adjoining to the given pixel 61 in the row and column directions leaks to the given pixel 61 by the crosstalk amount ($\lambda$). The spectral transmittance of the given pixel 61 is determined by these crosstalk amounts ($\lambda$).

Figure 8:
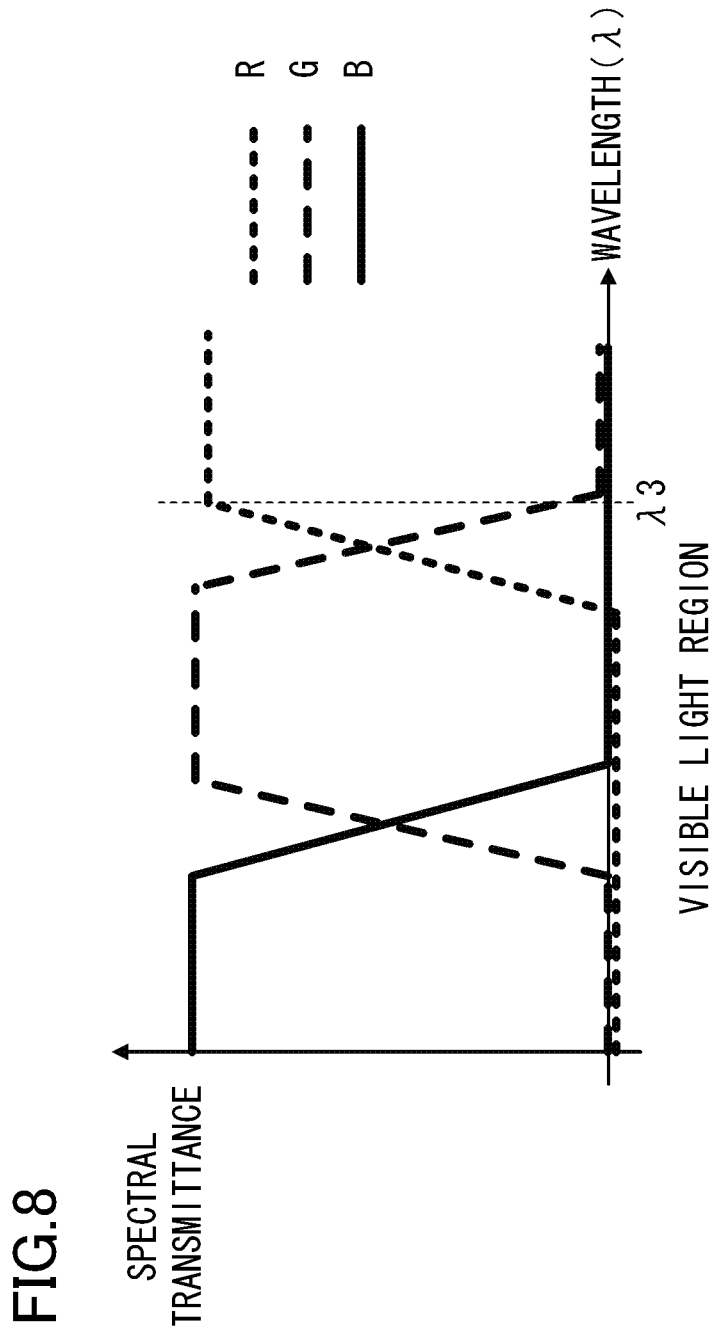
FIG. 8 is a view showing spectral transmittances of color filters of the primary-color Bayer array.

FIG. 8 is a view showing examples of the spectral transmittances of the color filters in the primary-color Bayer array. In a region on the long-wavelength side in FIG. 8 (region of $\lambda 3$ and longer in FIG. 8), the spectral transmittances of the color filters 72 differ largely from each other, and the color filters in the primary-color Bayer array have a large crosstalk amount in this long-wavelength region. More specifically, considering the influence of crosstalk, the spectral transmittance of the R color filter on the long-wavelength side will decrease, and the spectral transmittance of the G color filter on the long-wavelength side will increase. By simple calculation, when light having a wavelength at which the crosstalk amount exceeds 16.7% is incident, the magnitude relationship in signal amount between the pixels corresponding to the R and G color filters, for example, is reversed from the expected value. This is undesirable from the standpoint of color reproduction.

By contrast, in the image sensor 60 of this embodiment, the spectral transmittance of any pixel 61 is free from influence of crosstalk. As is found from the relational expression (1), if only the spectral transmittances of a given pixel, its two adjoining pixels in the row direction, and its two adjoining pixels in the column direction are equal to one other at a given wavelength k, the spectral transmittance of the give pixel undergoes no influence of crosstalk even though crosstalk occurs. More specifically, in the image sensor 60, the spectral transmittances of the W, R, Mg, and Ye color filters 72 are equal to one another in the wavelength region on the long-wavelength side (region of $\lambda 1$ to $\lambda 2$ shown in FIG. 5). Therefore, in the image sensor 60, even though the pixels 61 have their crosstalk amounts shown in FIG. 6, such crosstalk amounts are cancelled among them in the region of $\lambda 1$ to $\lambda 2$. In other words, in principle, the spectral transmittance of each of the pixels 61 is free from influence of crosstalk from the other pixels 61.

In the image sensor 60, the spectral transmittance is different between the color filters 72 of any two pixels 61 adjoining in the row direction, and between the color filters 72 of any two pixels 61 adjoining in the column direction, on the short-wavelength side (a region less than the wavelength $\lambda 1$ shown in FIG. 5). However, since the crosstalk amount on the short-wavelength side is small compared with that on the long-wavelength side as shown in FIG. 6, the influence of the difference in spectral transmittance between pixels on the spectral transmittance of the given pixel is small.

(Advantage of First Embodiment)

As described above, in this embodiment, all pixels can be kept from influence of crosstalk for incident light having a predetermined wavelength or longer.

More specifically, in the image sensor 60 of this embodiment, all color filters 72 transmit the red component, allowing mainly long-wavelength visible light to reach all pixels 61. Therefore, all pixels can cancel a crosstalk component occurring significantly on the long-wavelength side. As a result, degradation in image quality can be prevented or reduced.

Also, in this embodiment, since the color filter array 70 includes n×m unit arrays, the processor for converting the output of the image sensor 60 into a video signal can be simplified.

Moreover, in the unit arrays 71 in this embodiment, the color filters 72 transmitting the green component that largely contributes to the luminance signal are arranged in a zigzag fashion. Thus, the resolution of the luminance can be improved, and furthermore, with inclusion of white color filters, the sensitivity can be improved.

(Second Embodiment)

Figure 9:
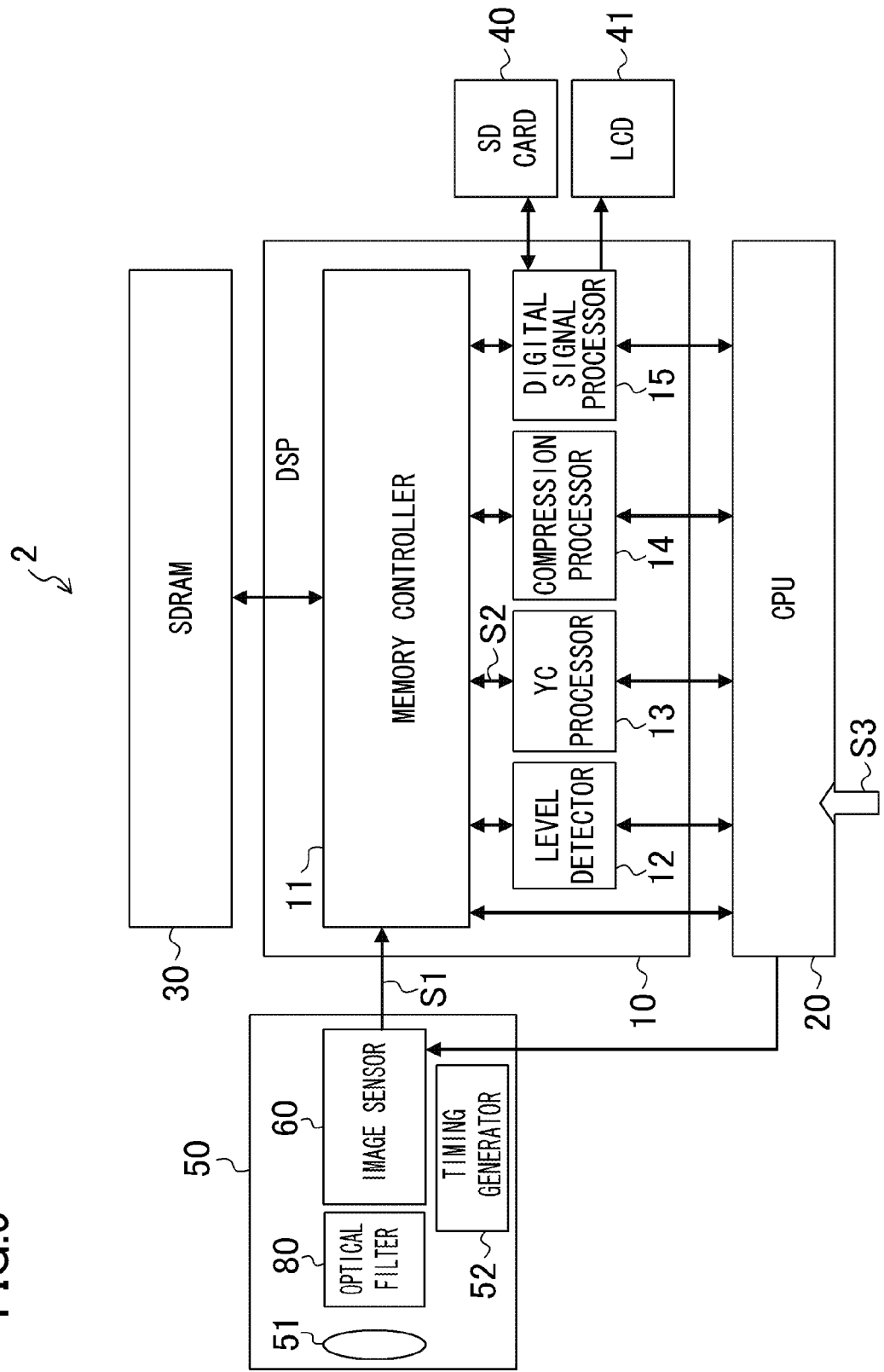
FIG. 9 is a block diagram of a digital video camera of the second embodiment of the present disclosure.

FIG. 9 is a block diagram of a digital video camera 2 of the second embodiment of the present disclosure. The digital video camera 2 is different from the digital video camera 1 of the first embodiment in the configuration of the imaging module 50. Specifically, the imaging module 50 of this embodiment additionally includes an optical filter 80. In the imaging module 50 of the second embodiment, at the time of shooting, incident light from an object is received by the image sensor 60 via the lens 51 and the optical filter 80.

The optical filter 80 prevents or reduces transmission of light having a wavelength longer than the wavelength region in which the spectral transmittances of the color filters 72 are equal to one another (see FIG. 5, etc.). With placement of the optical filter 80, it is possible to selectively prevent or reduce occurrence of crosstalk only in a wavelength region in which the crosstalk amount is too large to be ignored.

More specifically, the optical filter 80 is an IR cut filter that prevents or reduces transmission of light having wavelengths longer than a wavelength $\lambda'$ (which is to be described later). The optical filter 80 may absorb light or reflect light to cut light having wavelengths longer than a predetermined wavelength. For example, when the reflection type is used, the durability of the optical filter 80 can be improved. When the absorption type is used, the spectral transmittance does not much depend on the angle of light incident on the optical filter 80. This prevents occurrence of shading due to slant light, etc. and thus can prevent or reduce degradation in image quality.

Figure 10:
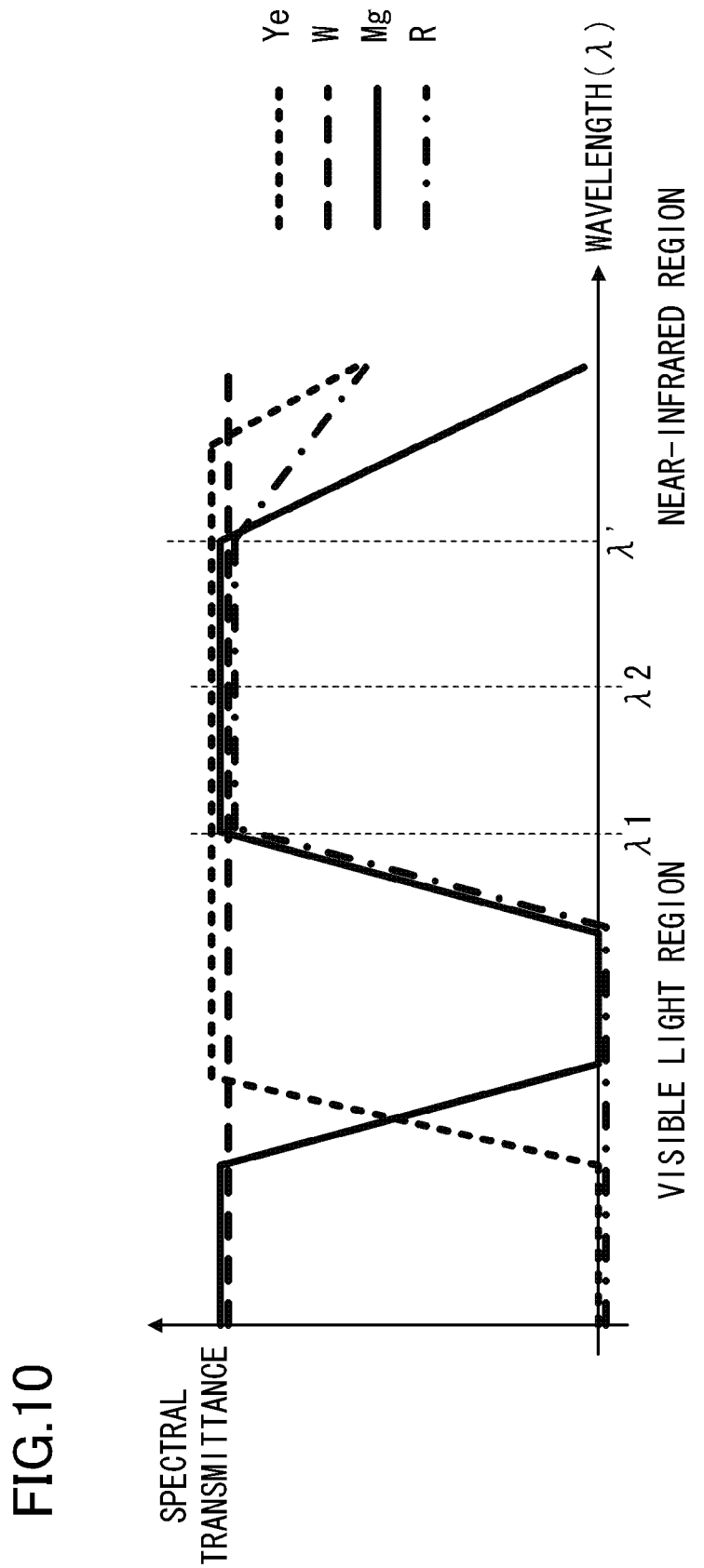
FIG. 10 is a view showing spectral transmittances of color filters in the second embodiment.

The spectral transmittances of the color filters 72 are also different from those in the first embodiment. FIG. 10 shows the spectral transmittances of the color filters 72. As shown in FIG. 10, the spectral transmittances of the color filters 72 are roughly equal to one another in a region from a long-wavelength portion of the visible light region to the wavelength $\lambda'$ in the near-infrared region, and are different from one another in a region longer than the wavelength $\lambda'$.

(Crosstalk in Second Embodiment)

Figure 11:
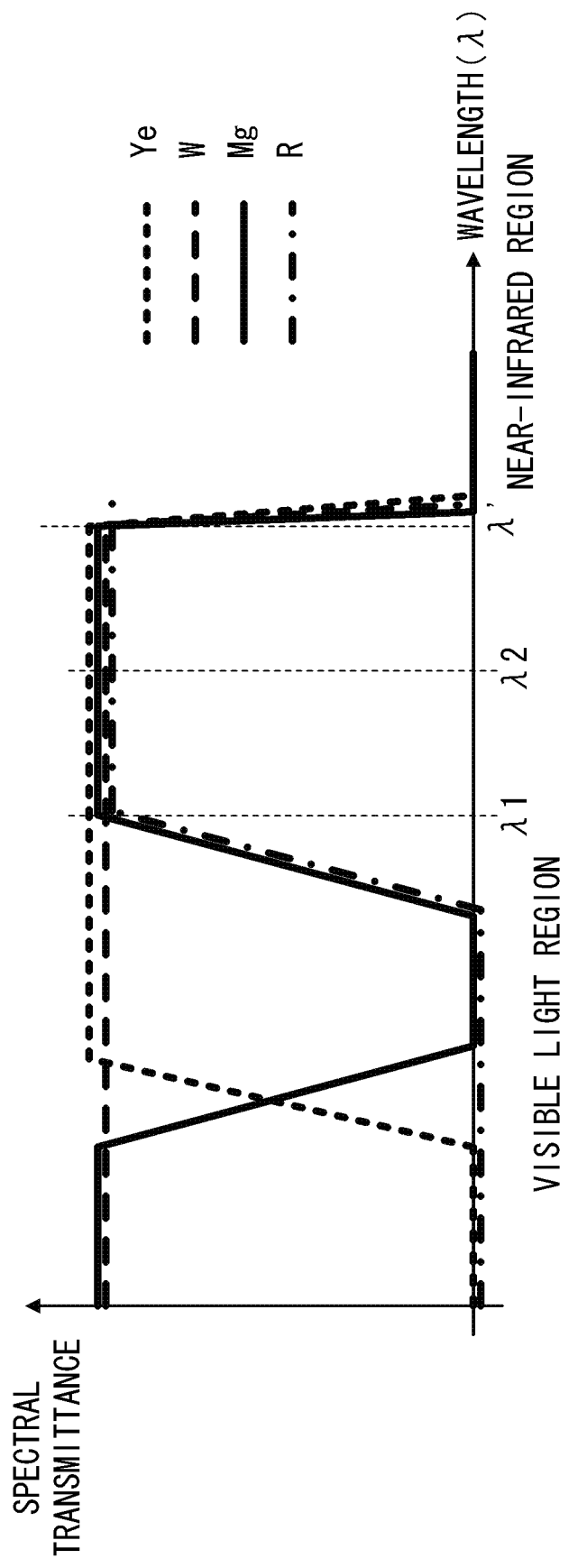
FIG. 11 is a view showing spectral transmittances in an image sensor having received incident light via an optical filter.

FIG. 11 is a view showing the spectral transmittances in the image sensor 60 having received incident light via the optical filter 80. As shown in FIG. 11, the incident light is hardly transmitted in the wavelength region longer than the wavelength λ' (i.e., region in which the spectral transmittances of the color filters 72 become different from one another). Therefore, the difference in spectral transmittance becomes extremely small in the region longer than the wavelength λ'. In the long-wavelength portion of the visible light region, the spectral transmittances of the color filters are roughly equal to one another. That is, in the digital video camera 2 of this embodiment, any crosstalk in the long-wavelength portion of the visible light region and in the wavelength portion up to the wavelength λ' in the near-infrared region, where influence of crosstalk is large, is cancelled.

(Variation of Second Embodiment)

(1) In the second embodiment, the optical filter 80 may have a characteristic of preventing or reducing transmission of long wavelengths in the visible light region.

(2) The wavelength region of which transmission is prevented or reduced by the optical filter 80 (region longer than λ' in the above example) is a mere example. The wavelength region for the optical filter 80 may be set so that the spectral transmittance calculated from the relational expression (1) is a desired value, for example.

(Third Embodiment)

A digital video camera of the third embodiment is different from the first embodiment in the configuration of the YC processor 13 and the configuration of the color filters 72. The color filter array in this embodiment includes both color filters 72 preventing or reducing transmission of light in the near-infrared region and color filters 72 allowing transmission of light in the near-infrared region.

Figure 12:
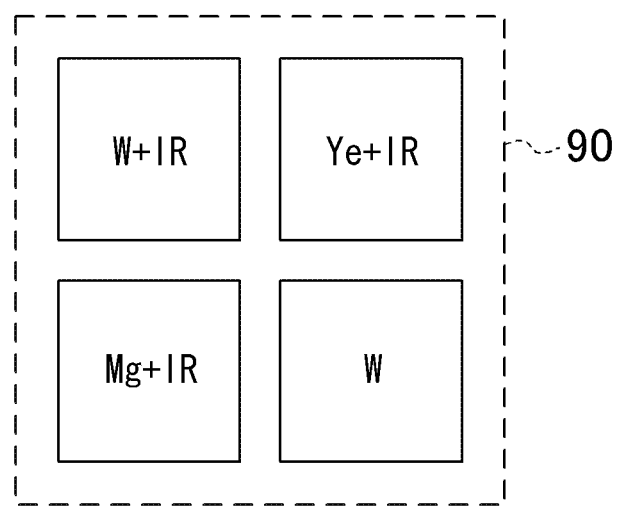
FIG. 12 is a view showing a unit array of color filters in the third embodiment.
Figure 13:
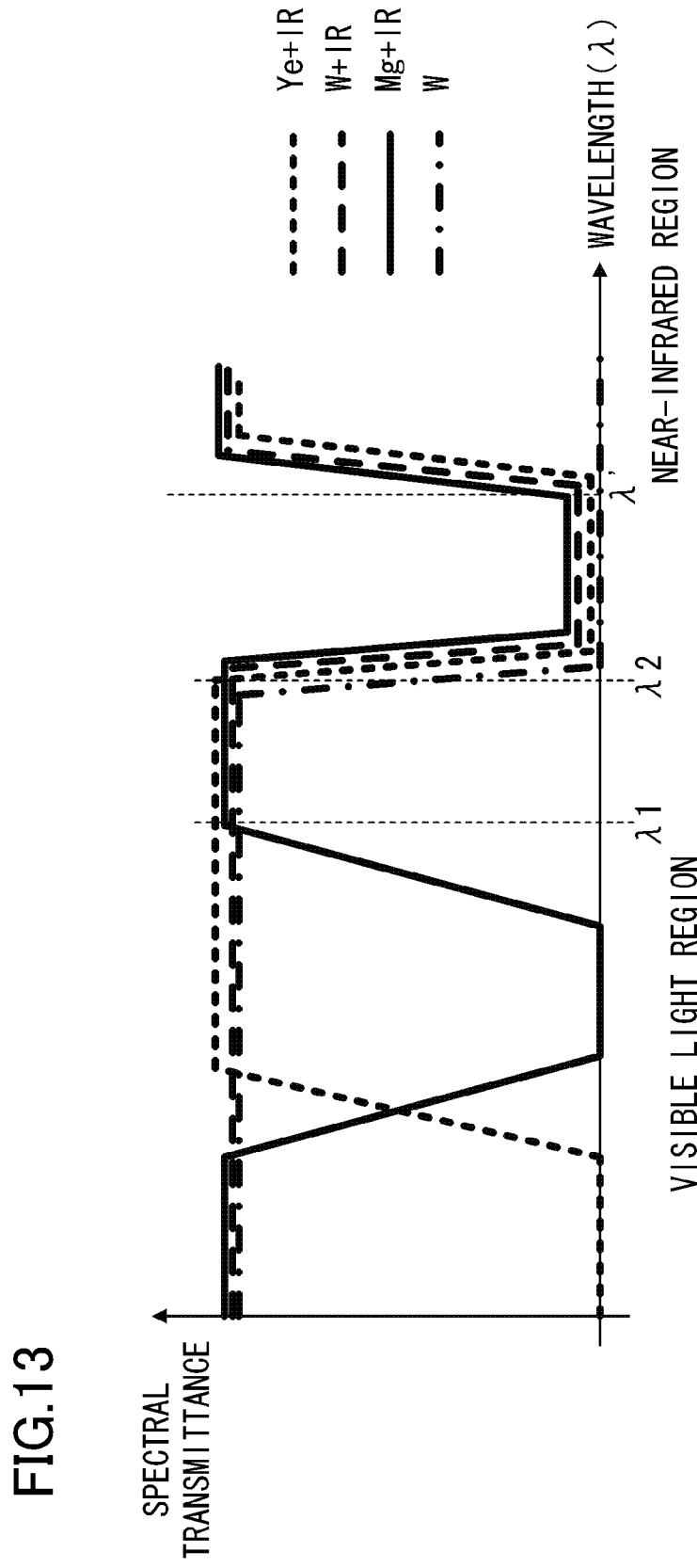
FIG. 13 is a view schematically showing spectral transmittances of W+IR, W, Mg+IR, and Ye+IR color filters.

FIG. 12 is a view showing a unit array 90 of color filters in the third embodiment. As shown in FIG. 12, the unit array 90 includes two rows×two columns, and such unit arrays 90 are arranged periodically to constitute a color filter array. In FIG. 12, W+IR, Ye+IR, Mg+IR, and W indicate the color components transmitted by the respective color filters 72: specifically, W+IR indicates transmission of white and the near-infrared region, Ye+IR indicates transmission of yellow and the near-infrared region, Mg+IR indicates transmission of magenta and the near-infrared region, and W indicates transmission of white. FIG. 13 is a view schematically showing the spectral transmittances of the W+IR, W, Mg+IR, and Ye+IR color filters 72. In FIG. 13, the spectral transmittance of the W+IR color filter 72 is indicated by the dashed line, that of the W color filter 72 is indicated by the one-dot dashed line, that of the Mg+IR color filter 72 is indicated by the solid line, and that of the Ye+IR color filter 72 is indicated by the dotted line. Note that, in the illustrated example, the color filters 72 prevent or reduce transmission of light in a wavelength region longer than the visible light region up to the wavelength λ'.

The YC processor 13 in this embodiment corrects the output of the image sensor for light having a wavelength in the near-infrared region. For example, in the environment where only light having a wavelength in the near-infrared region is present, only the W color filter 72, in the unit array 90, has no sensitivity to the near-infrared region. Therefore, the resultant imaging signal lacks in data corresponding to one pixel out of the two rows×two columns of the unit array 90. In view of this, the YC processor 13 in this embodiment adds data corresponding to the one pixel, to output a video signal for the near-infrared region.

In the environment where both visible light and light having a wavelength in the near-infrared region are present, some signals from the pixels 61 include information on (a given color of visible light+near-infrared light), while others include information on only visible light. In view of this, the YC processor 13 in this embodiment calculates R, G, and B signals from addition/subtraction between the pixels and matrix computation. From the values of the calculated R, G, and B signals, the YC processor 13 calculates information on near-infrared light, and outputs at least one of a video signal for the visible light and a video signal for the near-infrared light. In this way, data corresponding to one pixel having no sensitivity to the near-infrared region can be added in the environment where only light having a wavelength in the near-infrared region is present.

As described above, in the imaging system using the image sensor of this embodiment, shooting using light having a wavelength in the near-infrared region, not visible light, can be performed.

When the spectral transmittances in a wavelength region longer than the visible light region up to the wavelength λ' are not uniform, an optical filter may be added on the light path, aside from the color filters 72, to prevent or reduce transmission in the wavelength region longer than the visible light region up to the wavelength λ'. With this configuration, it is possible to make shooting using only visible light, effectively cancelling influence of crosstalk.

(Other Embodiments)

(1) In the above embodiments and variations, although it is most desirable that the spectral transmittances of the color filters 72 are equal to one another in a predetermined wavelength region as described above, it is acceptable for them to be roughly equal to one another, with some difference being permissible (the smaller the difference, the better).

(2) In the first and second embodiments and their variations, the YC processor 13 may reduce the high-frequency components depending on the magnitude of the green component or the blue component that is a color component not on the long-wavelength side, whereby variations in the sharpness of the entire video signal can be prevented or reduced. This reduction of the high-frequency components, as well as the compensation of the high-frequency components described earlier, by the YC processor 13 can be performed, not only for the luminance signal, but also for the color-difference signals. When the signals output from the YC processor 13 are R, G, and B signals, only compensation of the high-frequency components of R may be performed, or only reduction of the high-frequency components (of at least one of G and B) may be performed. Naturally, the compensation of the high-frequency components and the reduction of the high-frequency components may be performed simultaneously. By this processing, it is possible to reduce the difference between the resolution of the red component and the resolution of the green and blue components that include many high-frequency components, permitting improvement in image quality.

(3) In the above embodiments and variations, the array of the pixels 61 in the image sensor 60 may not necessarily be of the tetragonal lattice described above, but may be of the orthorhombic lattice, or otherwise may be an array where the centroids of the pixels are in a pixel shift state.

Figure 14:
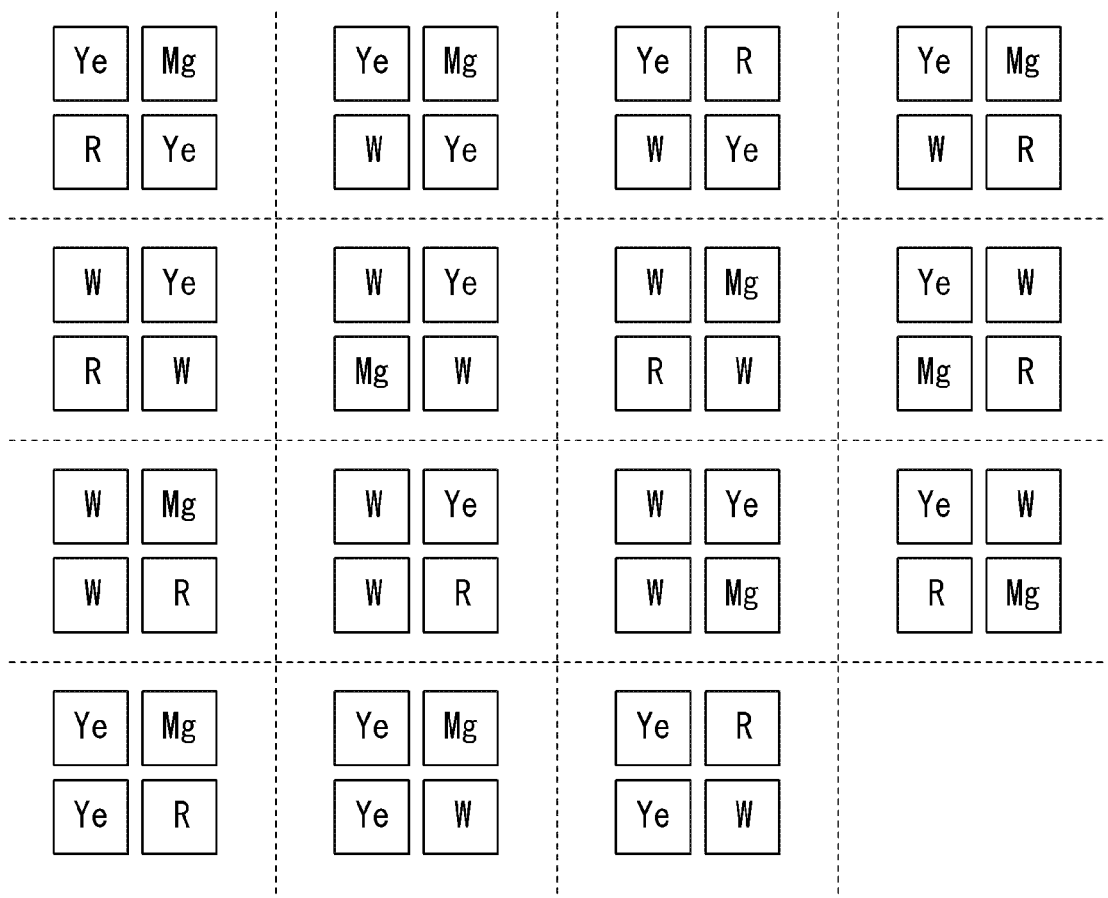
FIG. 14 shows variations of the unit array.

(4) In the first and second embodiment and their variations, the arrangement of the unit array 71 is a mere example. For example, the unit array 71 may be any of unit arrays as shown in FIG. 14. Otherwise, any of unit arrays obtained by rotating the unit arrays shown in FIG. 14 by 180 degrees, 90 degrees, 45 degrees, or any other angle may be used.

Figure 15:
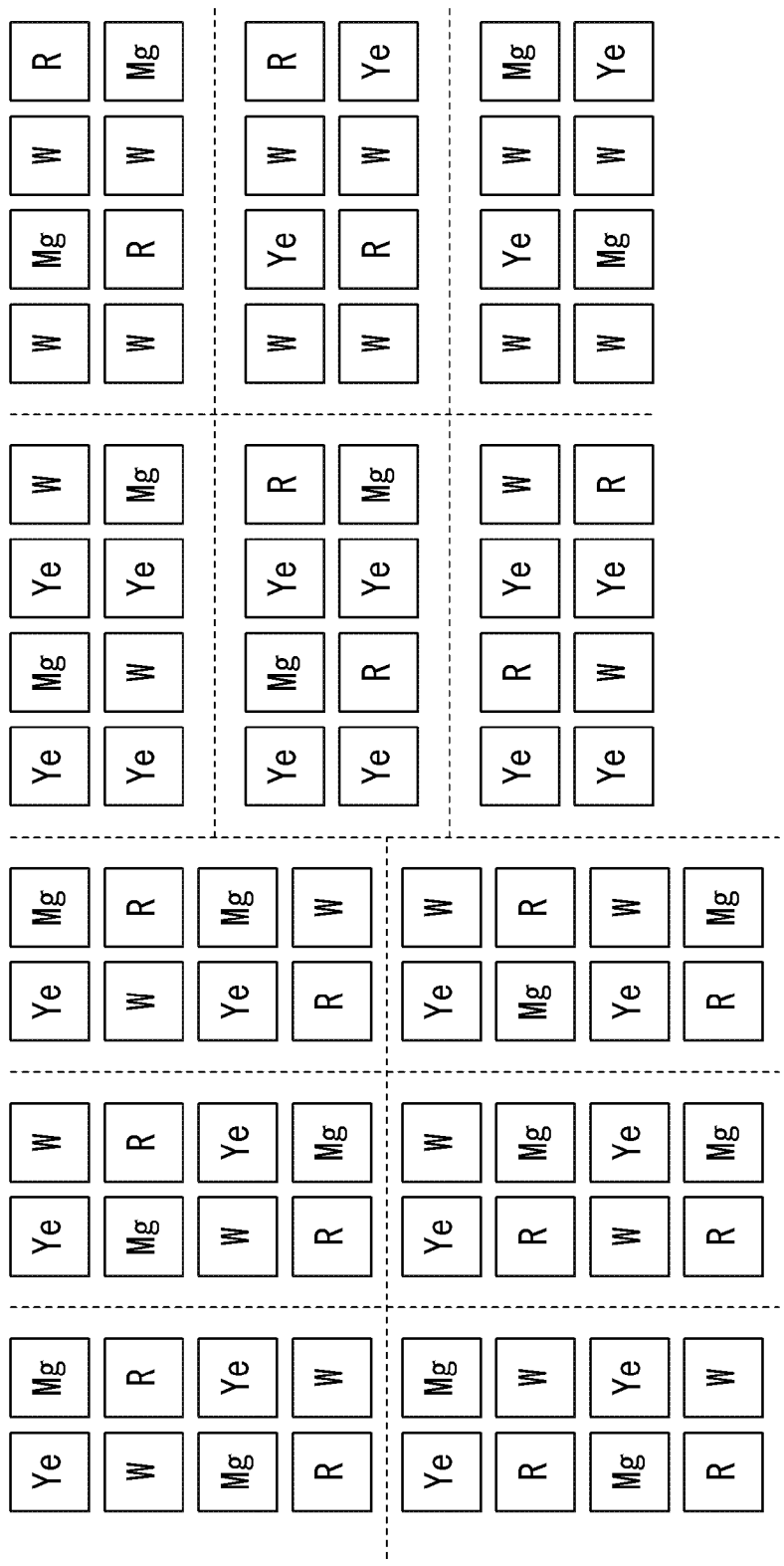
FIG. 15 shows other variations of the unit array.

(5) In the above embodiments and variations, although the unit array 71 includes two rows×two columns, any of unit arrays of n×m (n and m are natural numbers) as shown in FIG. 15 may be used. Otherwise, any of unit arrays obtained by rotating the unit arrays in FIG. 15 by 180 degrees, 90 degrees, 45 degrees, or any other angle may be used.

(6) In the above embodiments and variations, the materials of the color filters 72 may be organic pigments.

(7) In the above embodiments and variations, inorganic materials may be used, in place of the organic materials, as the materials of the color filters 72. Use of inorganic materials can simplify the fabrication process of the image sensor 60 (solid-state imaging device), and thus can reduce the cost. Such color filters prevent or reduce transmission of light by reflecting the light. In other words, in the color filters using inorganic materials, the spectral transmittances are determined mainly by reflection.

In the case of using inorganic materials, the color filters may be of a single-layer structure or a multilayer structure. When the single-layer structure is used, the durability of the color filters can be improved, and the fabrication cost can be reduced. When the multilayer structure is used, the spectral transmittances of the color filters 72 can be easily adjusted although the fabrication cost is high compared with the single-layer structure.

(8) In the first embodiment, an IR cut filter may be added to the imaging module 50, to prevent or reduce transmission of light having a wavelength in the near-infrared region by the image sensor 60. Also, in an imaging system where the pixels 61 are allowed to receive light having a wavelength in the near-infrared region simultaneously with visible light, the spectral transmittances in the near-infrared region may be made roughly equal to one another if variations in spectral transmittance due to crosstalk in the visible light region (wavelengths 380 nm to 780 nm) is sufficiently small. With this configuration, the output level of the image sensor 60 in a wavelength region where the human luminosity characteristic is not exhibited can be reduced, permitting improvement in image quality.

(9) In the above embodiments and variations, the image sensor 60 is a CCD type solid-state imaging device. Alternatively, it may be a CMOS type solid-state imaging device or an NMOS type solid-state imaging device.

(10) In the above embodiments and variations, the image sensor 60 is a surface irradiation type image sensor. Alternatively, it may be a back-surface irradiation type image sensor.

(11) In the above embodiments and variations, a digital video camera is shown as an example of the imaging system. Alternatively, an electronic still camera or an endoscope may be used.

(12) The kinds of color filters constituting the unit array 71 are mere examples. For example, a yellow color filter and a magenta color filter may be arranged in the first row in this order, and a red color filter and a yellow color filter may be arranged in the second row in this order. In this case, color filters transmitting the green component that greatly contributes to the luminance signal are arranged in a zigzag fashion, permitting improvement in the resolution of the luminance.

Alternatively, a yellow color filter and a magenta color filter may be arranged in the first row in this order, and a yellow color filter and a red color filter may be arranged in the second row in this order. In this case, although the resolution of the luminance in the horizontal direction degrades, the resolution in the vertical direction can be improved.

Alternatively, a yellow color filter and a magenta color filter may be arranged in the first row in this order, and a white color filter and a red color filter may be arranged in the second row in this order. In this case, color filters transmitting the red and blue components including color information are arranged in a zigzag fashion, permitting improvement in the resolution of the color signals.

Alternatively, a white color filter and a magenta color filter may be arranged in the first row in this order, and a red color filter and a white color filter may be arranged in the second row in this order. In this case, color filters transmitting the green component that greatly contributes to the luminance signal are arranged in a zigzag fashion, permitting improvement in the resolution of luminance. Moreover, with inclusion of more white color filters, further improvement in sensitivity is possible.

Alternatively, a white color filter and a yellow color filter may be arranged in the first row in this order, and a red color filter and a white color filter may be arranged in the second row in this order. In this case, the array includes more color filters transmitting the green component that greatly contributes to the luminance signal, permitting improvement in resolution.

Alternatively, a white color filter and a magenta color filter may be arranged in the first row in this order, and a white color filter and a red color filter may be arranged in the second row in this order. In this case, with inclusion of many white color filters, the sensitivity improves. Also, although the resolution of the luminance in the horizontal direction degrades, the resolution in the vertical direction can be improved.

Alternatively, a white color filter and a yellow color filter may be arranged in the first row in this order, and a white color filter and a red color filter may be arranged in the second row in this order. In this case, the array includes more color filters transmitting the green component that greatly contributes to the luminance signal, permitting improvement in resolution.

(13) In the first and second embodiments and their variations, in the unit array 71, the region where the spectral transmittances are equal to one another (wavelength region of $\lambda 1$ to $\lambda 2$ shown in FIG. 5) is a mere example. Such a region may be determined appropriately depending on the use of the imaging system.

For example, if $\lambda 1$ is in the range of 380 nm to 780 nm (visible light region), occurrence of crosstalk in the case of shooting in the visible light region can be reduced, permitting improvement in image quality.

If $\lambda 1$ is 780 nm (near-infrared region) or longer, occurrence of crosstalk in the case of shooting in the near-infrared region can be reduced, permitting improvement in image quality.

If $\lambda 1$ is in the range of 380 nm to 780 nm (visible light region) and $\lambda 2$ is also in the range of 380 nm to 780 nm but longer than $\lambda 1$, occurrence of crosstalk in only the visible light region can be reduced in the case of shooting in the visible light region, permitting improvement in image quality.

If $\lambda 1$ is in the range of 380 nm to 780 nm (visible light region) and $\lambda 2$ is 780 nm (near-infrared region) or longer, occurrence of crosstalk in both the visible light region and the near-infrared region can be reduced in the case of shooting in the visible light region and the near-infrared region, permitting improvement in image quality.

If $\lambda 1$ is 780 nm (near-infrared region) or longer and $\lambda 2$ is also 780 nm or longer but longer than $\lambda 1$, occurrence of crosstalk at a specific wavelength in the near-infrared region can be selectively reduced in the case of shooting in the near-infrared region, permitting improvement in image quality.

The solid-state imaging device of the present disclosure has an advantage that degradation in image quality due to crosstalk can be prevented or reduced. Thus, the present disclosure is useful as a solid-state imaging device that outputs incident light as an imaging signal, and an imaging module and an imaging system using the same.

What is claimed is:

1. A solid-state imaging device configured to output incident light from an object as an imaging signal, comprising:
a plurality of photoelectric conversion elements configured to perform photoelectric conversion on the incident light; and
a color filter array including at least three kinds of color filters different in filtering wavelength region,
wherein any of the color filters is placed for each of the photoelectric conversion elements to filter the incident light, and
the spectral transmittances of the color filters are equal to each other in a predetermined wavelength region which is included in a wavelength region of a wavelength of visible light and longer, and in the predetermined wavelength, the color filters prevent or reduce transmission of light having a wavelength in a near-infrared region, and transmit light having a wavelength longer than the near-infrared region.

2. The solid-state imaging device of claim 1, wherein the color filters are made of an organic material.

3. The solid-state imaging device of claim 1, wherein the color filters are made of an inorganic material.

4. The solid-state imaging device of claim 1, wherein the color filters prevent or reduce transmission of light by reflecting the light.

5. The solid-state imaging device of claim 1, wherein the color filters prevent or reduce transmission of light by absorbing the light.

6. The solid-state imaging device of claim 3, wherein the color filters have a multilayer structure.

7. The solid-state imaging device of claim 3, wherein the color filters have a single-layer structure.

8. The solid-state imaging device of claim 1, wherein all of the kinds of color filters transmit a red component.

9. The solid-state imaging device of claim 8, wherein the color filter array is comprised of at least three kinds of color filters selected from a red color filter, a magenta color filter, a yellow color filter, and a white color filter.

10. The solid-state imaging device of claim 8, wherein the color filter array includes arrangement of a plurality of unit arrays each having n rows×m columns (n and m are natural numbers).

11. The solid-state imaging device of claim 10, wherein n=m in the unit array.

12. The solid-state imaging device of claim 11, wherein the unit array includes two rows×two columns, a yellow color filter and a magenta color filter are arranged in the first row in this order, and a red color filter and a yellow color filter are arranged in the second row in this order.

13. The solid-state imaging device of claim 11, wherein the unit array includes two rows×two columns, a yellow color filter and a magenta color filter are arranged in the first row in this order, and a red color filter and a white color filter are arranged in the second row in this order.

14. The solid-state imaging device of claim 11, wherein the unit array includes two rows×two columns, a yellow color filter and a magenta color filter are arranged in the first row in this order, and a yellow color filter and a red color filter are arranged in the second row in this order.

15. The solid-state imaging device of claim 11, wherein the unit array includes two rows×two columns, a yellow color filter and a magenta color filter are arranged in the first row in this order, and a white color filter and a red color filter are arranged in the second row in this order.

16. The solid-state imaging device of claim 11, wherein the unit array includes two rows×two columns, a white color filter and a magenta color filter are arranged in the first row in this order, and a red color filter and a white color filter are arranged in the second row in this order.

17. The solid-state imaging device of claim 11, wherein the unit array includes two rows×two columns, a white color filter and a yellow color filter are arranged in the first row in this order, and a red color filter and a white color filter are arranged in the second row in this order.

18. The solid-state imaging device of claim 11, wherein the unit array includes two rows×two columns, a white color filter and a magenta color filter are arranged in the first row in this order, and a white color filter and a red color filter are arranged in the second row in this order.

19. The solid-state imaging device of claim 11, wherein the unit array includes two rows×two columns, a white color filter and a yellow color filter are arranged in the first row in this order, and a white color filter and a red color filter are arranged in the second row in this order.

20. The solid-state imaging device of claim 8, wherein the color filter array is a mixed array including color filters preventing or reducing transmission of light having a wavelength in a near-infrared region and color filters allowing transmission of light having a wavelength in the near-infrared region.

21. The solid-state imaging device of claim 1, wherein the solid-state imaging device is any one of a CMOS type solid-state imaging device, an NMOS type solid-state imaging device, and a CCD type solid-state imaging device.

22. An imaging module comprising:
the solid-state imaging device of claim 1; and
a lens.

23. An imaging system comprising:
the imaging module of claim 22; and
a signal processing circuit configured to process the imaging signal output from the solid-state imaging device of the imaging module.

24. The imaging system of claim 23, wherein the signal processing circuit enhances a high-frequency component of the imaging signal based on the ratio of a red component included in the imaging signal.

25. The imaging system of claim 23, wherein the signal processing circuit reduces a high-frequency component of the imaging signal based on the ratio of a blue component and the ratio of a green component included in the imaging signal.

26. The imaging system of claim 23, wherein the imaging system is any one of an electronic still camera, an electronic movie camera, and an endoscope.

* * * * *